United States Patent [19]
Pan et al.

[11] Patent Number: 6,008,139
[45] Date of Patent: Dec. 28, 1999

[54] METHOD OF ETCHING POLYCIDE STRUCTURES

[75] Inventors: Shaoher Pan; Songlin Xu, both of San Jose, Calif.

[73] Assignee: Applied Materials Inc., Santa Clara, Calif.

[21] Appl. No.: 08/665,657

[22] Filed: Jun. 17, 1996

[51] Int. Cl.$^6$ .................................................. H01L 21/302
[52] U.S. Cl. .................... 438/730; 438/711; 438/719; 438/721
[58] Field of Search .............................. 118/723; 216/68, 216/64, 72, 79; 156/643.1, 646.1, 657.1; 438/710, 712, 713, 721, 711, 719, 730

[56] References Cited

U.S. PATENT DOCUMENTS

| | | | |
|---|---|---|---|
| 4,411,734 | 10/1983 | Maa | 156/643 |
| 4,460,435 | 7/1984 | Maa | 156/643 |
| 4,490,209 | 12/1984 | Hartman | 156/643 |
| 5,094,712 | 3/1992 | Becker et al. | 156/643 |
| 5,167,762 | 12/1992 | Carr et al. | 156/657 |
| 5,192,702 | 3/1993 | Tseng | 437/47 |
| 5,211,804 | 5/1993 | Kobayashi | 156/665 |
| 5,256,245 | 10/1993 | Keller et al. | 156/643 |
| 5,310,453 | 5/1994 | Fukasawa et al. | 156/643 |
| 5,408,130 | 4/1995 | Woo et al. | 257/758 |
| 5,431,772 | 7/1995 | Babie et al. | 156/643.1 |
| 5,437,765 | 8/1995 | Loewenstein | 216/51 |
| 5,505,322 | 4/1996 | Shinohara et al. | 216/78 |
| 5,591,301 | 1/1997 | Grewal | 156/643.1 |
| 5,607,542 | 3/1997 | Wu et al. | 156/345 |
| 5,660,681 | 8/1997 | Fukuda et al. | 438/695 |
| 5,662,819 | 9/1997 | Kadomura | 438/711 |
| 5,685,941 | 11/1997 | Forster et al. | 156/643 |
| 5,779,926 | 7/1998 | Ma et al. | 216/67 |
| 5,783,101 | 7/1998 | Ma et al. | 216/68 |
| 5,866,483 | 2/1999 | Shiau et al. | 438/720 |
| 5,880,033 | 3/1999 | Tsai | 438/710 |

FOREIGN PATENT DOCUMENTS

| | | |
|---|---|---|
| 0376546 | 7/1990 | European Pat. Off. . |
| 0474244 | 3/1992 | European Pat. Off. . |
| 0516043 | 12/1992 | European Pat. Off. . |
| 2285336 | 7/1995 | United Kingdom . |

OTHER PUBLICATIONS

Gadgil, P.K., et al., "Anisotropic Highly Selective Electron Cyclotron Resonance Plasma Etching of Polysilicon," *J. Vac. Sci. Technol. A*, vol. 10, No. 4, Jul./Aug. 1992, pp. 1303–1306.

Communication—European Patent Search Report dated Jul. 24, 1998.

"Gate Electrode Etching Using a Transformer Coupled Plasma"; Yoshida et al., Japanese Journal of Applied Physics, vol. 34, Part 1, No. 4B–1195, pp. 2089–2094.

Maruyama, et al., "Mechanism of $WSi_2$ Etching Using ECR Plasma," *1993 Dry Process Symposium*, pp. 55–60.

Park, et al., "Plasma Etching of Tungsten Polycide Structure Using $NF_3$–Mixed Halocarbon Etchant," *J. Electrochem. Soc.*, vol. 138(9):2736–2740, Sep. 1991.

*Primary Examiner*—R. Bruce Breneman
*Assistant Examiner*—George Goudreau
*Attorney, Agent, or Firm*—Janah and Associates

[57] ABSTRACT

A method for etching metal silicide layers 22a, 22b and polysilicon layers 24a, 24b on a substrate 20 with high etching selectivity, and anisotropic etching properties, is described. In the method, the substrate 20 is placed in a plasma zone 55, and process gas comprising chlorine, oxygen and optionally helium gas, is introduced into the plasma zone. A plasma is formed from the process gas to etch the metal silicide layer 22 at high etching selectivity relative to etching of the polysilicon layer 24, while providing substantially anisotropic etching of the metal silicide and polysilicon layers. Preferably, the plasma is formed using combined inductive and capacitive plasma sources.

16 Claims, 11 Drawing Sheets

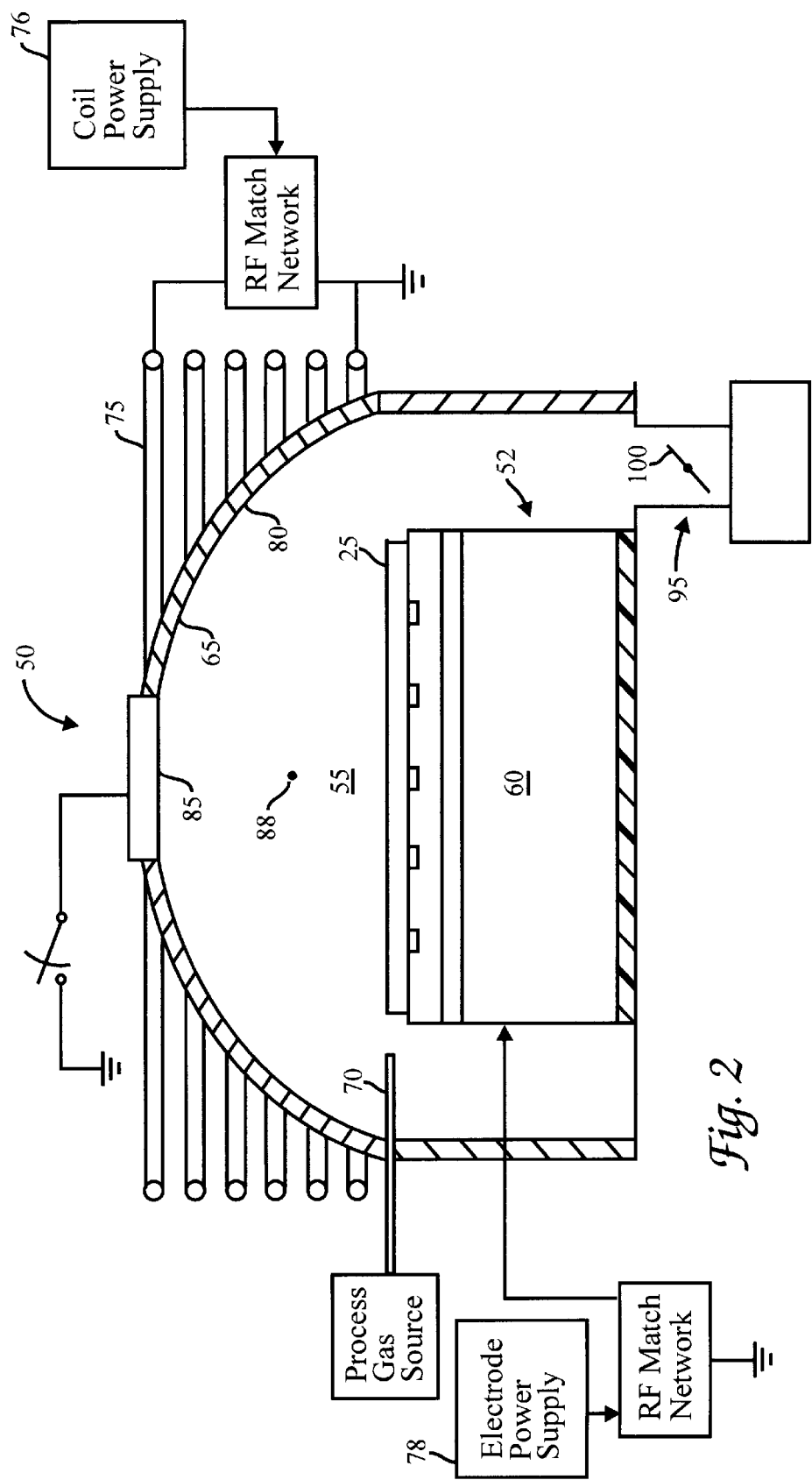

METHOD OF ETCHING POLYCIDE STRUCTURES

CROSS-REFERENCE TO RELATED APPLICATION

This application is related to U.S. patent application Ser. No. 08/664,526, entitled "METHOD FOR ETCHING METAL SILICIDE WITH HIGH SELECTIVITY TO POLYSILICON," to Patti Tsai, filed on even date herewith, which is incorporated herein by reference.

BACKGROUND

The present invention relates to a method for etching polycide structures on semiconductor substrates.

In integrated circuit fabrication, refractory metal silicides, such as for example tungsten, tantalum, titanium, and molybdenum silicides, are used to form high density, high speed, highly electrically conductive interconnect features and lines for electrically connecting devices formed on semiconductor substrates. For example, $WSi_x$ layers can be deposited on silicon dioxide to serve as gate electrodes for integrated circuits. However, at the silicide and oxide interface, diffusion of silicon from the $SiO_2$ layer into the refractory metal silicide layer causes the metal silicide layer to have unacceptably high electrical resistance. "Polycide" stacks were developed to reduce the diffusion problems with metal silicide layers. With reference to FIGS. 1a through 1d, typical polycide structures on a semiconductor substrate 20 comprise refractory metal silicide layers 22, 22a, 22b (which are used interchangeably herein to designate metal silicide layers) deposited over doped or undoped polysilicon layers 24, 24a, or 24b (which are used interchangeably herein to designate polysilicon layers). The polycide structures are formed over silicon dioxide layers 26, 26a, or 26b (which are used interchangeably herein to designate silicon dioxide layers) on the substrate 20, and provide a low electrical resistance interconnect with excellent interfacial characteristics.

In conventional methods of fabricating the polycide interconnect structures, the metal silicide layers 22 are deposited over polysilicon layers 24. For example, commonly assigned U.S. Pat. No. 5,500,249, to Telford et al., incorporated herein by reference, describes a chemical vapor deposition process for depositing $WSi_x$ films on polysilicon via plasma enhanced chemical vapor deposition of tungsten hexafluoride and dichlorosilane. After deposition of the metal silicide layer 22, photoresist material is applied on the polycide layers and exposed to light to form a desired pattern of interconnect features using conventional photolithographic processes. The patterned resist 30 serves as a mask for etching of the polycide structure using conventional etching processes to provide the shape of the etched feature 40 illustrated in FIG. 1b. Thereafter, the deposition and etching process can be repeated to form additional layers of polycide stacks, as illustrated in FIGS. 1c and 1d.

Conventional etching processes use a microwave or capacitive plasma of halogen-containing gases to etch the polycide stack of layers. Commonly used fluorinated etchant gases include $CF_4$, $SF_6$, and $NF_3$; chlorine-containing etchant gases include $Cl_2$ and $BCl_3$; and bromine-containing etchant gases include HBr. One problem conventional etching processes is their relative inability to provide high etching selectivity ratios for etching metal silicide with respect to polysilicon, while simultaneously forming anisotropically etched features, with good profile microloading. High profile microloading occurs when the cross-sectional profile of the etched features 40 vary as a function of the spacing between the etched features 40. This occurs when the passivating deposits (i.e., complex polymeric byproducts that deposit on the sidewalls of features and reduce etching of the sidewalls) formed on closely spaced or "dense" features are removed at higher rates than on the features separated by relatively large distances. This occurs because plasma ions are channeled between, and bounce-off, the sidewalls of the closely spaced features to excessively etch the passivating layer thereon. In contrast, etching of passivating deposits on sidewalls of spaced apart features is not as high because of reduced channeling effects. This results in high profile microloading with the cross-sectional shape of the features 40 varying as a function of the spacing between the features.

Etching selectivity ratio is the ratio of the rate of etching of the metal silicide layer 22 to the rate of etching of the underlying polysilicon layer 24. It is particularly desirable to have high etching selectivity ratios for polycide structures having a non-planar and highly convoluted topography, as schematically illustrated in FIG. 1c. In these structures, the portion of the conformal metal silicide layer 22b between the etched features as shown by the arrow A, is thicker than the portion of the metal silicide layer 22b on top of the etched features as shown by the arrow B. Thus, at a certain time during the etching process, at the portion B the metal silicide layer is etched through and etching of the underlying polysilicon layer begins, while at the portion A, the thicker metal silicide layer 22b is still being etched. This effect requires that the polysilicon layer 24b at the portion B be etched sufficiently slowly relative to the rate of etching of the silicide layer, that the entire polysilicon layer 24b at portion B is not etched through, before completion of etching of the thicker portions of the convoluted metal silicide layer 22b at portion A. Thus, it is desirable to etch the metal silicide layer 22b at a faster rate relative to the rate of etching of the polysilicon layer 24.

High etching selectivity ratios are obtained by using process gas compositions that etch different materials at different etching rates, depending upon the chemical reactivity of the process gas with the different materials. However, etching metal silicide with high selectivity to polysilicon is particularly difficult, because both materials contain elemental silicon and most conventional etchant plasmas etch the silicon portion to form gaseous $SiCl_x$ or $SiF_x$ species. Thus, it is difficult for the etchant plasma to chemically distinguish and preferentially etch the metal silicide layer 22 faster than the polysilicon layer 24. Also, the more chemically active plasma etching processes, such as ECR and/or microwave plasma processes, provide more dissociated chemically active etchant species, and result in isotropic etching of the silicide layers, as described below.

It is also desirable to etch the polycide stack to form anisotropically etched features 40, which result when the metal silicide and polysilicon layers are etched substantially vertically to provide features having straight sidewalls 48. Excessive etching at the sidewalls 48 of the etched features results in undesirable inwardly or outwardly sloped walls. A degree of anisotropic etching is obtained when dissociated species in the etchant gas combine to form complex polymeric byproducts that deposit as passivating layers on the sidewalls of freshly etched features 40, and serve to limit further etching of the sidewalls 48. More typically, anisotropic etching is obtained by imparting a highly directional kinetic energy to the charged species in the etchant plasma (by subjecting the plasma to an electric field perpendicular to the substrate 20), that causes the plasma species to energetically impinge upon and remove substrate material in the vertical etching direction. However, different materials are sputter etched by the highly energized plasma at the same etch rate providing little or no control over etching selectivity. For these reasons, it is difficult to obtain anisotropic etching in combination with high etching selectivity ratios for etching metal silicide on polysilicon.

Etchant gases compositions containing HBr are also often used to etch polycide structures. For example, U.S. Pat. No. 5,192,702 issued Mar. 9, 1993, incorporated herein by reference, discloses a method of anisotropically etching polysilicon using HBr, $Cl_2$, and He—$O_2$. However, the low vapor pressure of HBr causes contaminant HBr or Br-containing particles to condense upon the substrate 20. The contaminant particles absorb ambient moisture to form hydrobromic species that significantly affect the performance of the integrated circuit chip. Furthermore, many HBr gas compositions typically etch polysilicon faster than the metal silicide, for example the etching selectivity ratio of $WSi_x$ relative to polysilicon is typically about 0.7:1.

Multi-step etching processes that use different process gases for etching the different layers of material constituting the polycide structure have also been used. For example, U.S. Pat. No. 5,094,712 issued May 10, 1992, incorporated herein by reference, discloses a method of etching a polycide structure using (i) an oxide etching step using $CHF_3$, $CF_4$ and inert gas, (ii) a silicide etching step using He, $O_2$, and $SF_6$, (iii) a polysilicon etching step using HBr and $Cl_2$. However, such multiple step processes reduce process throughput, because the process chamber has to be exhausted of residual process gas before each successive etching step. Also, it is relatively expensive to connect multiple sources of gas to the process chamber. Furthermore, multiple step etching processes require precise control to determine the endpoint of each etching step, and in particular, between the successive silicide and polysilicon etching steps.

Thus, it is desirable to have an etching process for etching polycide structures with high etching selectivity, and in particular, for etching metal silicide layers at faster etch rates than polysilicon. It is further desirable for the etching process to provide substantially anisotropic etching, and to provide uniform etching rates across the surface of the substrate. It is still further desirable to have an etching process that is substantially absent HBr etchant gas, and that can be performed in a single step.

SUMMARY

The present invention is directed to a method of etching polycide structures comprising metal silicide and polysilicon layers, substantially anisotropically, and with high etching selectivity. In the method, a substrate is placed in a plasma zone, and process gas comprising chlorine, oxygen, and optionally an inert gas such as helium, is introduced into the plasma zone. A plasma is formed from the process gas to provide high etching selectivity of the metal silicide layer relative to the polysilicon layer, while providing substantially anisotropic etching of the metal silicide and polysilicon layers.

Preferably, the etchant plasma is formed using combined inductive and capacitive plasma sources, for example, in a process chamber comprising an inductor coil and process electrodes. The process gas is ionized in the chamber to form plasma ions that energetically impinge on the substrate by (i) applying an RF current at a source power level to the inductor coil, and (ii) applying an RF voltage at a bias power level to the process electrodes. A power ratio $P_r$ of the source power level to the bias power level is selected to provide highly selectivity etching and substantially anisotropic etching.

Preferably, the gas composition and power ratio $P_r$ of the plasma are selected so that the etch rate of the metal silicide layer is at least 0.5 times the etch rate of the polysilicon layer, and the metal silicide and polysilicon layers are etched to form features that have sidewalls that form angles of from about 88° to more preferably about 90°, with a surface of the substrate. Preferably, the ratio of the mass flow of chlorine to the combined mass flow of oxygen and helium is from about 3:1 to about 20:1. More preferably, the power ratio $P_r$ of the source power level to the bias power level is at least about 2:1.

DRAWINGS

These and other features, aspects, and advantages of the present invention will become better understood from the following drawings and description, which show and describe examples of the invention, and from the appended claims, where:

FIG. 2 is a schematic view in vertical cross-section of a process chamber suitable for practicing the etching process of the present invention;

DESCRIPTION

Figure 1A:
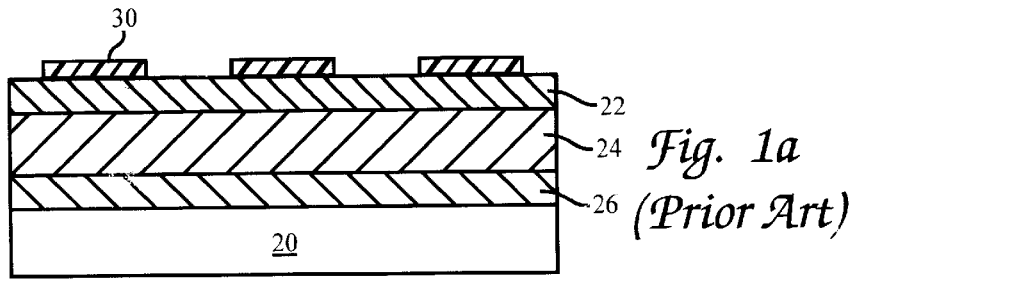
FIG. 1a is a schematic in vertical cross-section of a polycide stack comprising a metal silicide layer deposited over a polysilicon layer on a semiconductor substrate.
Figure 1B:
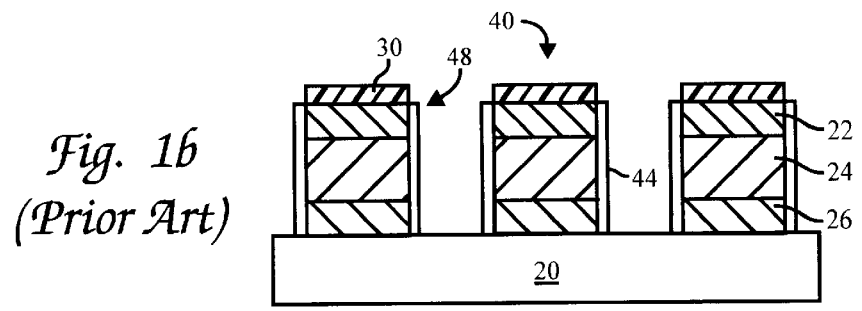
FIG. 1b is a schematic in vertical cross-section of the substrate of FIG. 1a after etching of the metal silicide and polysilicon layers showing substantially anisotropically etched features.
Figure 1C:
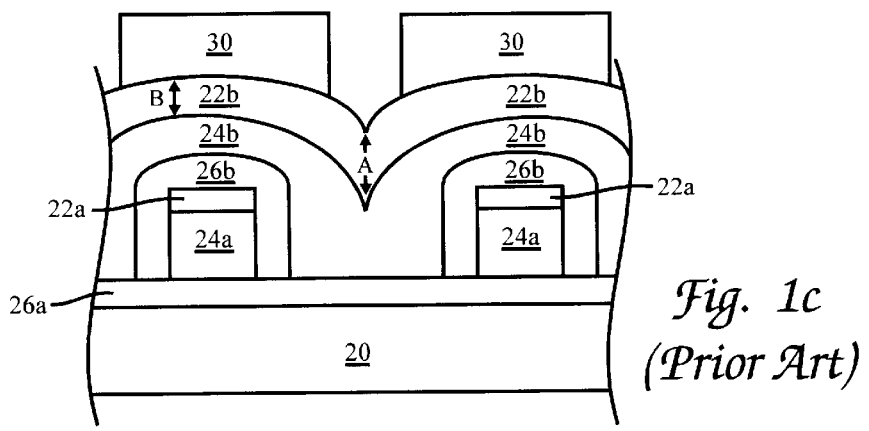
FIG. 1c is a schematic in vertical cross-section of a non-planar and highly convoluted topography of a metal silicide layer deposited over a polysilicon layer on a substrate.
Figure 1D:
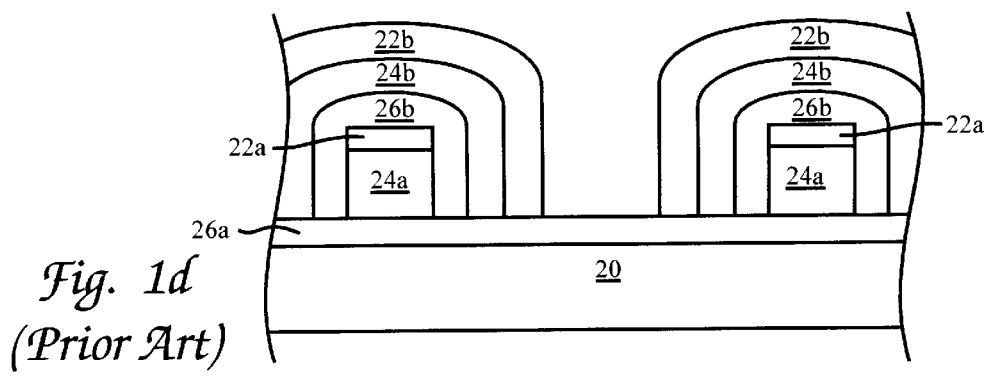
FIG. 1d is a schematic in vertical cross-section of the substrate of FIG. 1c after etching of the metal silicide and polysilicon layers showing substantially anisotropically etched features.
Figure 3A:
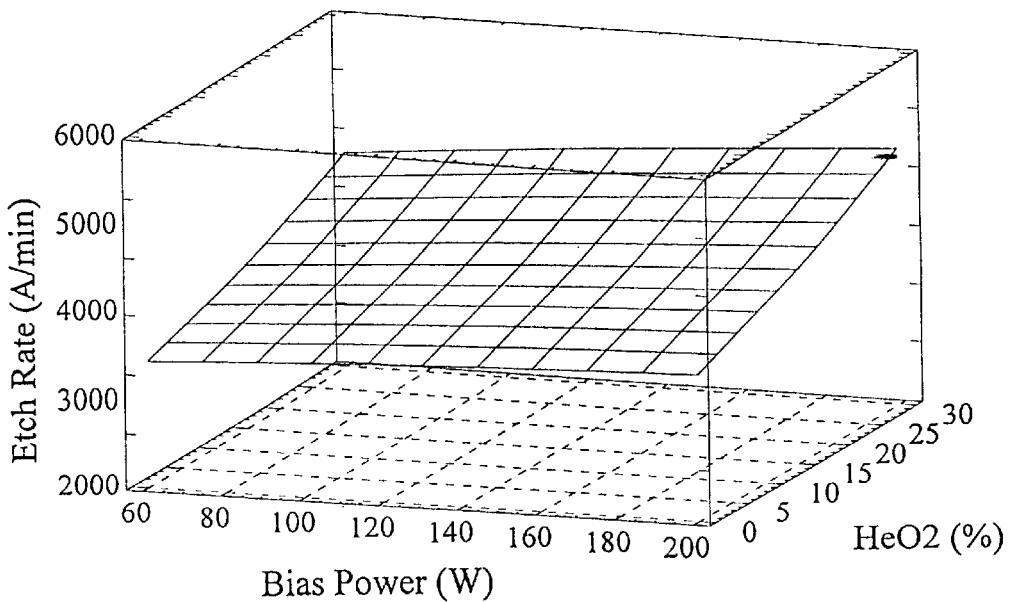
FIGS. 3a–3c are graphs showing the $WSi_x$ etch rate, polysilicon etch rate, and $WSi_x$ to polysilicon etching selectivity, respectively, for increasing bias power and He—$O_2$ flow rates.
Figure 3B:
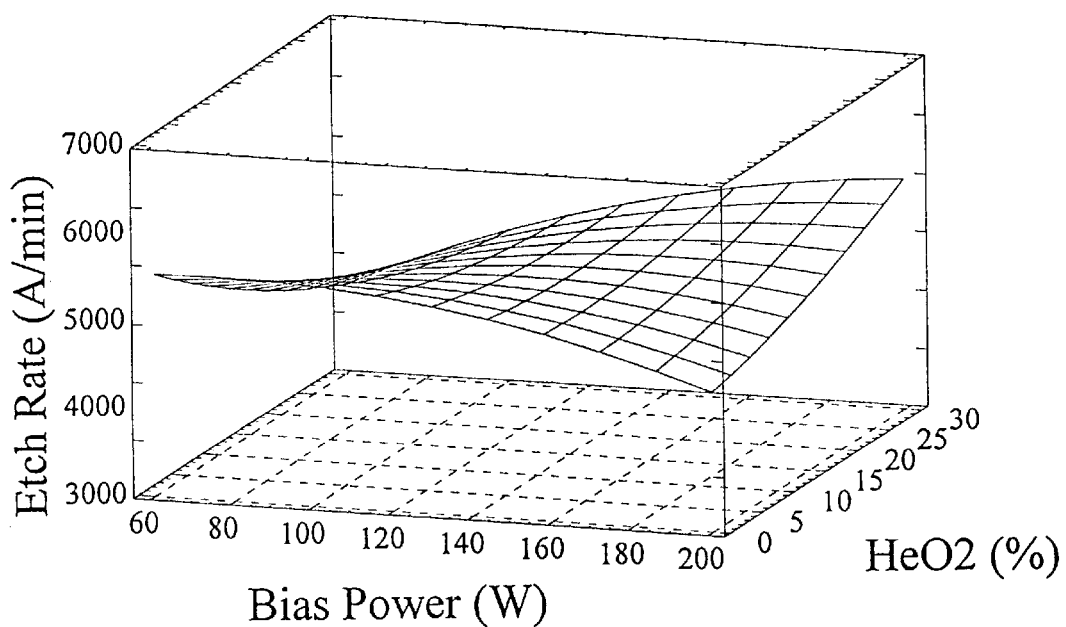
Figure 3C:
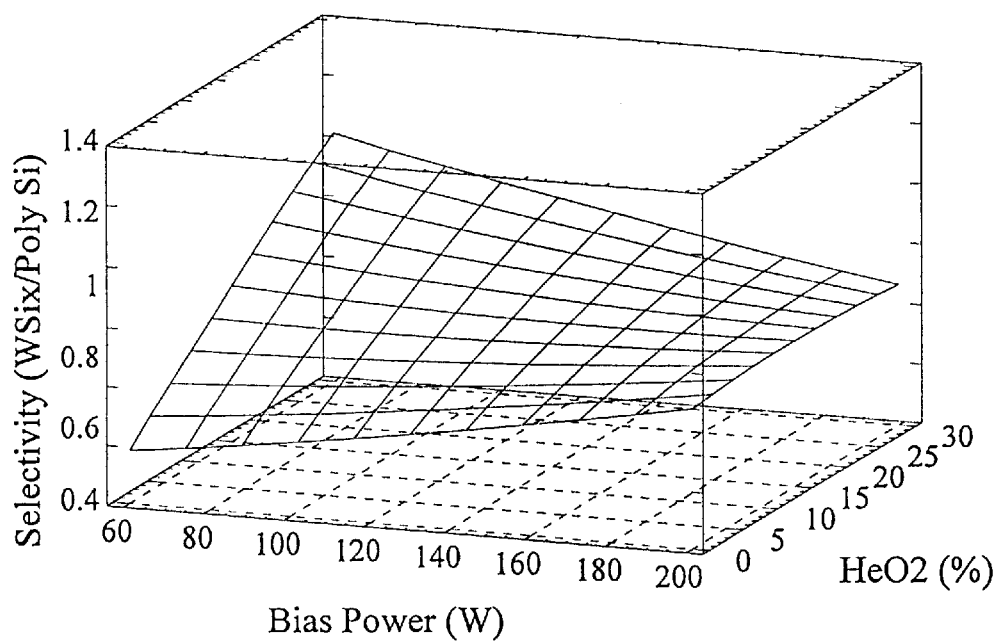
Figure 4A:
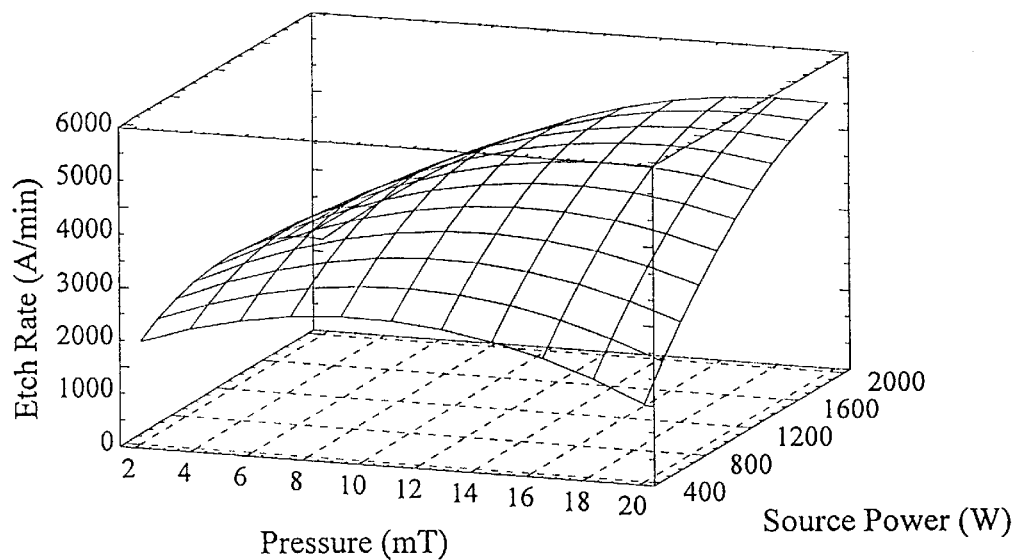
FIGS. 4a–4c are graphs showing the $WSi_x$ etch rate, polysilicon etch rate, and $WSi_x$ to polysilicon etching selectivity, respectively, for increasing pressure and source power.
Figure 4B:
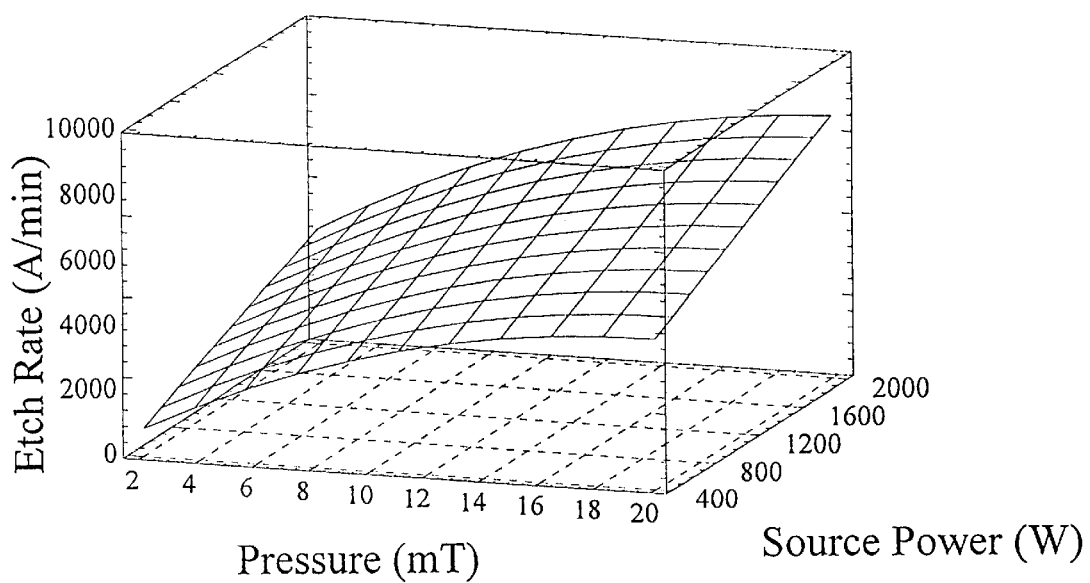
Figure 4C:
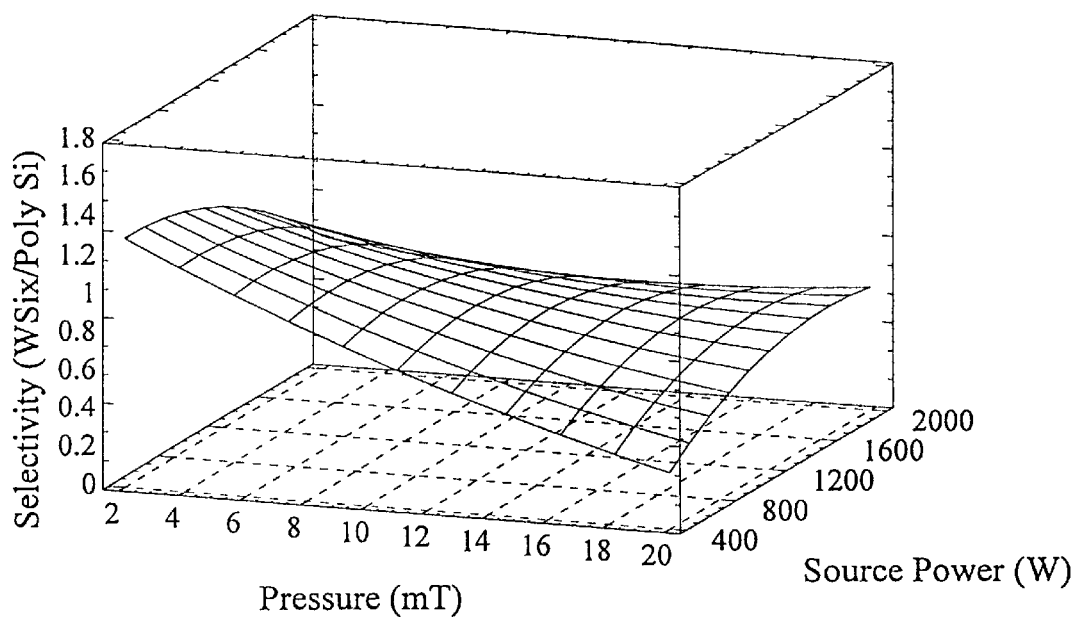
Figure 5A:
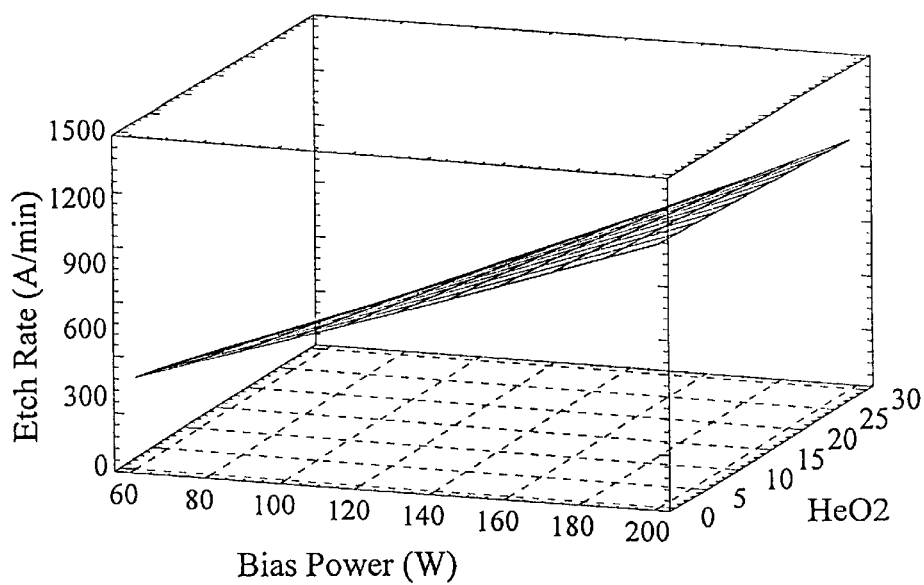
FIGS. 5a–5b are graphs showing the silicon dioxide etch rate, and polysilicon to silicon dioxide etching selectivity, respectively, for increasing bias power and He—$O_2$ flow rates.
Figure 5B:
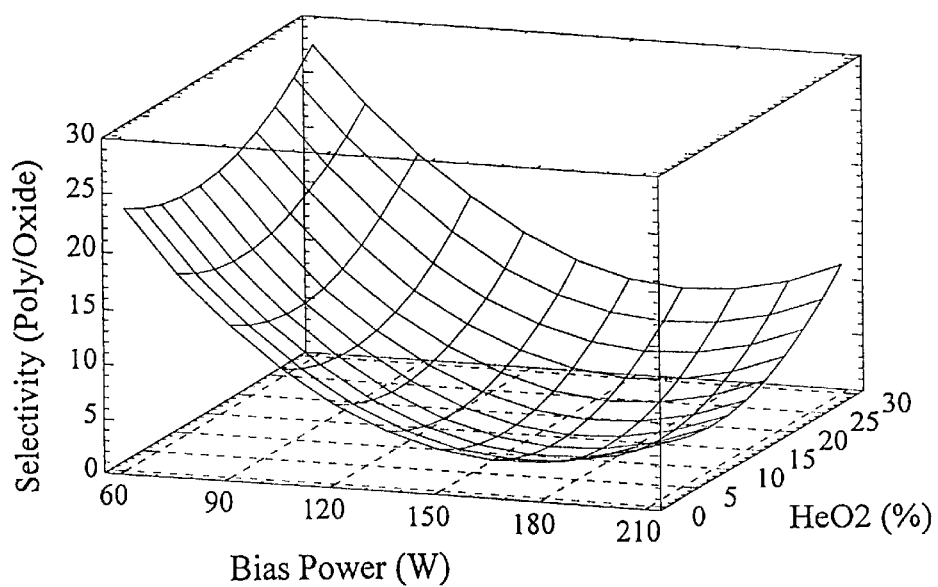

The etching process of the present invention is useful for etching a substrate 20 having polycide stacks comprising metal silicide layers 22 or 22a, 22b on underlying polysilicon layers 22 or 24a, 24b, as shown in FIGS. 1a–1d, with high etching selectivity, good etch rates, and anisotropic etching. The substrate 20 can be made of any material, such as glass, ceramic, metal, polymer, or semiconductor substrates, such as a silicon or gallium arsenide wafers. The metal silicide layer 22 on the substrate 20 typically comprises, for example, tungsten, tantalum, titanium, or molybdenum silicides, having a thickness of about 500 Å to about 10000 Å. The polysilicon layer 24 below the metal silicide layer 22 also typically comprises a thickness of about 500 Å to about 10000 Å. The polycide stack is deposited on a silicon dioxide layer 26 having a thickness of about 1000 Å.

The metal silicide and polysilicon layers 22, 24 are etched to form electrical interconnect lines on the substrate 20. Typically, photoresist 30 such as "RISTON," manufactured by DuPont de Nemours Chemical Company, is applied on the metal silicide layer 22 to a thickness of about 0.4 to about 1.3 micron, and the features 40 to be etched in the metal silicide and polysilicon layers, are defined using conventional lithographic processes in which the resist 30 is exposed to a pattern of light through a mask that corresponds to the desired configuration of features 40. The etched features 40 are typically sized from about 0.1 to about 10 microns, and more typically about 0.2 to 1 microns, and the spacing between the features is typically from 0.1 microns to 10 microns. During the etching process, polymeric passivating deposits 44 form on the sidewalls 48 of the etched features 40, as explained below.

The metal silicide layer 22 and polysilicon layer 24 are etched in a process chamber 50, such as for example, a Decoupled Plasma Source "DPS" chamber, schematically illustrated in FIG. 2, and commercially available from Applied Materials Inc., Santa Clara, Calif. The process chamber 50 is also described in U.S. patent application Ser. No. 08/597,445, entitled "RF Plasma Reactor with Hybrid Conductor and Multi-Radius Dome Ceiling" filed on Feb. 2, 1996; and U.S. patent application Ser. No. 08/389,889, filed on Feb. 15, 1993—both of which are incorporated herein by reference. The particular embodiment of the process chamber 50 shown herein, is suitable for processing of semiconductor substrates 20, is provided only to illustrate the invention, and should not be used to limit the scope of the invention. For example, the etching process of the present invention can be used to etch any substrate, and can be used for manufacturing processes other than semiconductor fabrication.

To perform the process, the chamber 50 is evacuated to a pressure of less than 0.1 mTorr, and a substrate 20 is placed on a support 52 within a plasma zone 55 in the chamber. The substrate 20 can be held in place during the etching process using a mechanical or electrostatic chuck with grooves in which a coolant gas, such as helium, is held to control the temperature of the substrate 20. The temperature of the substrate 20 is maintained at about 20° C. to 80° C. At least a portion of the support 52 is electrically conductive and serves as a process cathode electrode 60. The cathode electrode 60, in conjunction with sidewalls of the chamber 50 that are electrically grounded to serve as an anode electrode 65, form process electrodes in the plasma zone 55.

Process gas is introduced into the chamber 50 through a gas distributor 70 peripherally disposed about the substrate 20, and the chamber is maintained at a pressure ranging from about 0.1 to about 100 mTorr, and more typically from 1 to 50 mTorr. A plasma is formed from the process gas using a plasma generator that couples an electric field into the plasma zone 55. The plasma generator can comprise an inductor coil 75 adjacent to the process chamber 50, that is capable of forming an inductive electric field in the chamber when powered by source power level current supplied by a coil power supply 76. Preferably, an RF current is applied to the inductor coil 75 at a source power level of preferably from about 400 Watts to about 3000 Watts.

In addition to the inductor coil, the cathode and anode electrodes 60, 65, powered by an electrode power supply 78 are used to generate a capacitive electric field in the process chamber 50. Typically an RF voltage at a bias power level of from about 20 to about 1000 Watts is applied to the cathode electrode 60, and the anode electrode 65 is electrically grounded. The capacitive electric field is perpendicular to the plane of the substrate 20, and accelerates inductively formed plasma species toward the substrate 20 to provide more vertically oriented anisotropic etching of the substrate. The frequency of the RF voltage applied to the process electrodes 60, 65, and/or inductor coil 75 is typically from about 50 Khz to about 60 MHz, and more typically about 13.56 MHz.

The plasma zone 55 of the process chamber 50 has a center 88 and a volume of at least about 10,000 cm$^3$, and more preferably from about 10,000 to about 50,000 cm$^3$, immediately surrounding the center 88. The ceiling 85 of the chamber 50 can be flat or rectangular shaped, arcuate, conical, dome-shaped, or multi-radius dome shaped. Preferably, the process chamber 50 has a multi-radius dome-shaped ceiling 85 above the substrate 20 to provide a uniform distribution of plasma source power across the entire volume of the plasma zone 55 to increase dissociation of the etchant gas, as for example described in U.S. patent application Ser. No. 08/596,960, entitled "Plasma Process for Etching Multicomponent Alloys," filed on Feb. 5, 1996, to Ma et al., which is incorporated herein by reference. The dome-shaped ceiling 85 reduces dissociated ion recombination losses near the substrate 20 to less than those experienced with a flat ceiling, so that plasma ion density is more uniform across the substrate 20. This is because ion recombination losses are affected by the proximity of the ceiling 85, and the dome-shaped ceiling is further from the substrate center than a flat ceiling.

Preferably, the inductor coil 75 wrapped around the sidewall 80 of the process chamber 50 is a multi-radius dome-shaped inductor coil having a "flattened" dome shape that provides more efficient use of plasma source power and increased plasma ion density directly over the substrate center. This is because ion density is affected by local ionization near the inductor coil 75, and a multi-radius inductor coil is closer to the substrate center than a hemispherical coil. In another preferred embodiment, the ceiling 85 comprising a multi-radius dome having at least a center radius R and a corner radius r less than the center radius R, wherein R/r is from about 2 to about 10.

The plasma formed in the plasma zone 55 can also be enhanced using magnetically enhanced reactors, in which a magnetic field generator, such as a permanent magnet or electromagnetic coils, are used to apply a magnetic field in the plasma zone 55 to increase the density and uniformity of the plasma. Preferably, the magnetic field comprises a rotating magnetic field with the axis of the field rotating parallel to the plane of the substrate 20, as described in U.S. Pat. No. 4,842,683, issued Jun. 27, 1989, which is incorporated herein by reference. The magnetic field in the chamber 50 should be sufficiently strong to increase the density of the ions formed in the plasma, and sufficiently uniform to reduce charge-up damage to features such as CMOS gates. Generally, the magnetic field as measured on a surface of the substrate is less than about 500 Gauss, more typically from about 10 to about 100 Gauss, and most typically from about 10 Gauss to about 30 Gauss.

Spent process gas and etchant byproducts are exhausted from the process chamber 50 through an exhaust system 95 capable of achieving a minimum pressure of about $10^{-3}$ mTorr in the process chamber 50. A throttle valve 100 is provided in the exhaust for controlling the pressure in the chamber 50. Also, an optical endpoint measurement technique is often used to determine completion of the etching process for a specific layer by measuring the change in light emission of a particular wavelength corresponding to a detectable gaseous species. A sudden decrease or increase in the amount of the detectable species, such as silicon species, that results from chemical reaction of the process gas with the silicon dioxide layer 26, indicates completion of etching of the metal silicide layer 22 and start of etching of the underlying layer.

The etching process of the present invention provides high etch rates, and highly selective etching of metal silicide relative to polysilicon. The process gas used in the etching process comprises, and more preferably consists essentially of (i) chlorine, (ii) oxygen, and optionally (iii) inert gas. The chlorine gas is ionized to form atomic chlorine and chlorine-containing species that etch the metal silicide layer 22 and polysilicon layer 24 on the substrate 20. For example, silicon in the metal silicide and polysilicon layers 22, 24 can be etched by chlorine-containing ions and neutrals to form volatile $SiCl_x$ species that are exhausted from the chamber 50. The chlorine gas can comprise $Cl_2$, or can comprise other chlorine-containing gases that are equivalent to chlorine, for example, HCl, $BCl_3$, and mixtures thereof. The oxygen gas ionizes to form ions and excited radicals of atomic oxygen and oxygen-containing species that enhance the rate of etching of the metal silicide layer 22, while simultaneously reducing the rate of etching of the polysilicon layer 24 and resist layer 30. This serves to enhance the etching selectivity ratios of etching metal silicide relative to polysilicon or resist. Suitable oxygen gases include for example, $O_2$, $O_3$, and other equivalent oxygen-containing gases.

In addition to oxygen, an inert gas such as helium can also be added to the process gas. In particular, it has been discovered that the addition of helium does not appear to change the metal silicide to polysilicon etching selectivity. However, the higher ionization potential of helium, as compared to oxygen, provides highly energetic atomic species that enhance etch rates and provide improved anisotropic etching properties. The helium gas can also serve as a diluent gas that reduces the residence time of the process gases in the chamber to significantly improve profile microloading effects. The inert gas preferably comprises helium, but can also comprise other inert gases, such as for example, xenon, argon, or krypton.

The combination of chlorine, oxygen, and inert gas such as helium gas, is found to unexpectedly increase the rate of etching of metal silicide layer 22 and reduce the rates of etching of silicon-containing underlayers, such as the polysilicon layer 24, particularly at low plasma bias power levels and high plasma source power levels. However, excessively high flow rates of the oxygen and helium gas at lower high bias power levels (or low source power levels) can cause more isotropic etching of the substrate by removing the passivating deposits 44 formed on the etched features, and can also result in excessively low polysilicon etch rates. It is believed that a combined inductive and capacitive plasma formed from the chlorine, oxygen, and helium gas, causes the gas mixture to simultaneously chemically etch and sputter etch the metal silicide and polysilicon layers to remove material at different rates from the different materials. This serves to reduce the rate of etching of the polysilicon layer 24 relative to the rate of etching of the metal silicide layer 22. For these reasons, the combined flow rate of oxygen and helium gas is maintained lower than the flow rate of the chlorine gas to provide sufficient chlorine-containing species to rapidly etch the substrate 20, while providing high silicide to silicon etching selectivity, and anisotropic etching.

The unexpected results provided by the $Cl_2$—$O_2$—He process gas are demonstrated in FIGS. 3–8 which show the effect of increasing oxygen and helium flow rates, bias and source power levels, and pressure, on the rate of etching of a metal silicide layer comprising $WSi_x$, polysilicon, and silicon dioxide. FIGS. 3a–3c show the $WSi_x$ etch rate, polysilicon etch rate, and $WSi_x$ to polysilicon etching selectivity, respectively, for increasing plasma bias power levels and He—$O_2$ flow rates. It is observed that increasing oxygen and helium flow rates significantly increases the etching selectivity of $WSi_x$ to polysilicon at low plasma bias power levels, and reduces etching selectivity at high plasma bias power levels. FIGS. 4a–4c show the $WSi_x$ etch rate, polysilicon etch rate, and $WSi_x$ to polysilicon etching selectivity, respectively, for increasing pressure and source power. In contrast to the effect of bias power levels, it is observed that increasing gas pressure generally decreases the etching selectivity of $WSi_x$ to polysilicon at low plasma source power levels. It is also surprising that the silicide to polysilicon etching selectivity increases or remains constant for increasing pressure at higher source power levels. Thus, addition of oxygen and helium to chlorine can increase $WSi_x$ etch rates while simultaneously decreasing the polysilicon etch rates, even though both materials contain elemental silicon. This result provides increased etching selectivity rates for etching $WSi_x$ relative to polysilicon while simultaneously providing higher $WSi_x$ etching rates, which is a highly desirable combination.

Figure 6A:
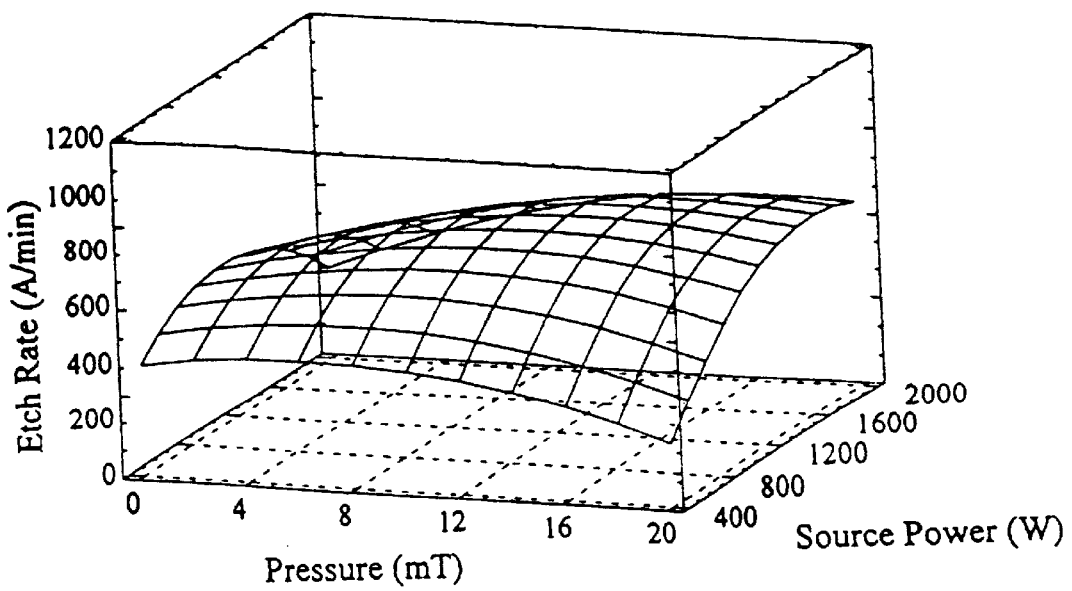
FIGS. 6a–6b are graphs showing the silicon dioxide etch rate, and polysilicon to silicon dioxide etching selectivity, respectively, for increasing pressure and source power.
Figure 6B:
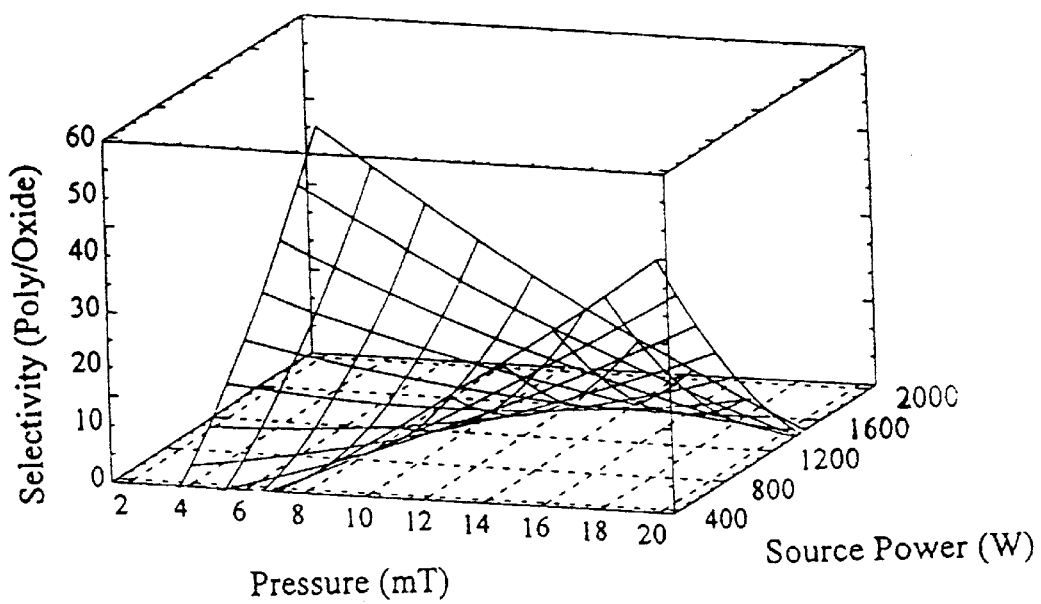
Figure 7A:
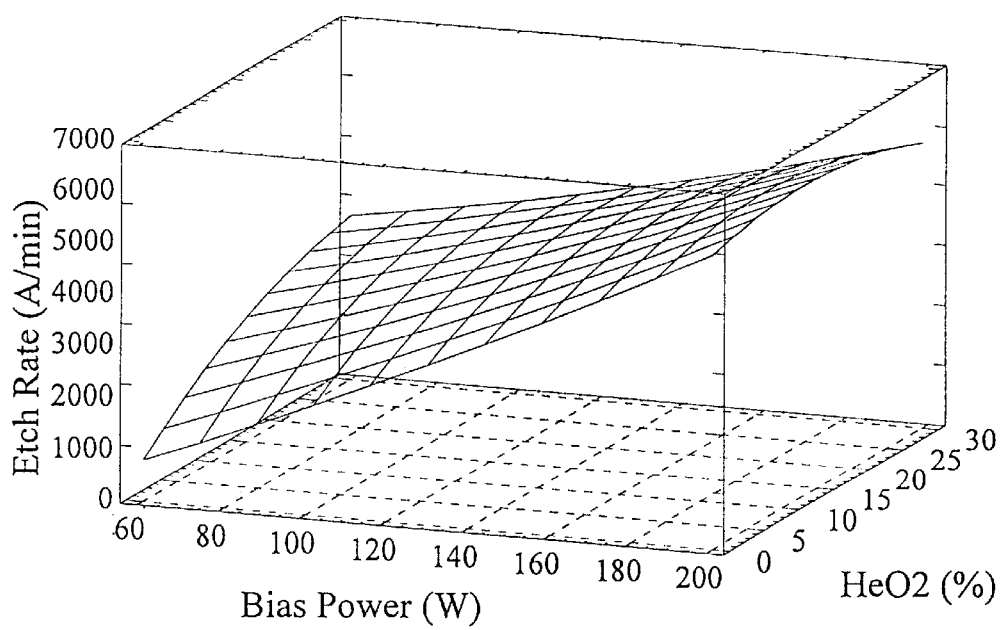
FIGS. 7a–7b are graphs showing the photoresist etch rate, and polysilicon to photoresist etching selectivity, respectively, for increasing bias power and He—$O_2$ flow rates.
Figure 7B:
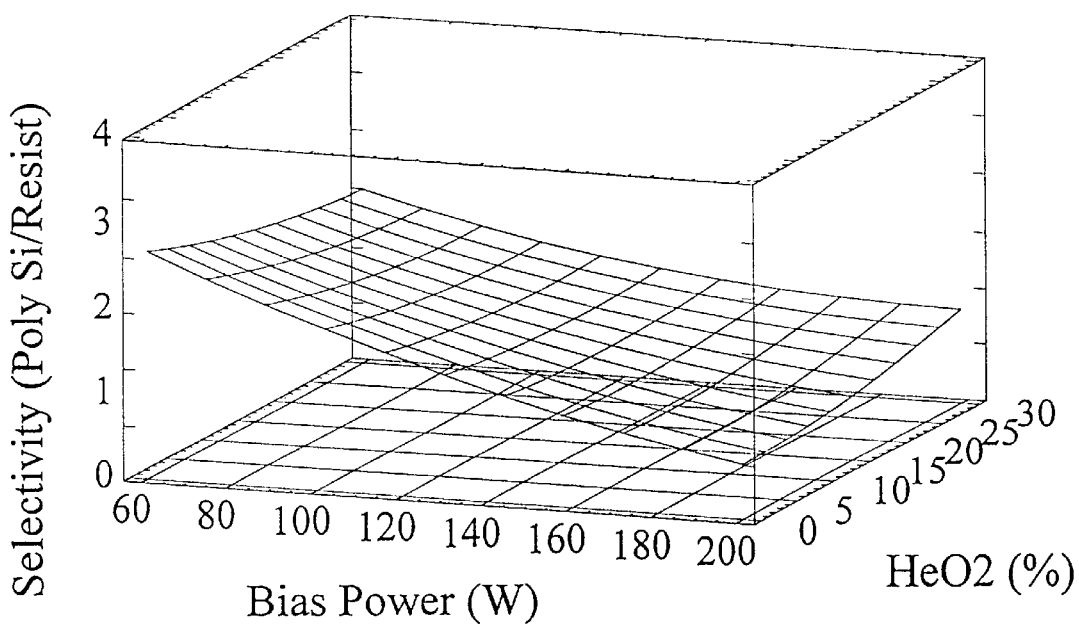

FIGS. 5a–6b show the silicon dioxide etch rate, and polysilicon to silicon dioxide etching selectivity, respectively, for increasing bias power and He—$O_2$ flow rates (FIGS. 5a–5b), or increasing pressure and source power (FIGS. 6a–6b). Generally, the silicon dioxide etch rate lowers for increasing plasma bias power levels. Furthermore, the silicon dioxide etch rate increases for increasing plasma source power levels at low pressures, and decreases for increasing plasma source power levels at high pressures. Average etching selectivity of polysilicon to silicon dioxide ranged from about 5:1 to about 160:1.

Figure 8A:
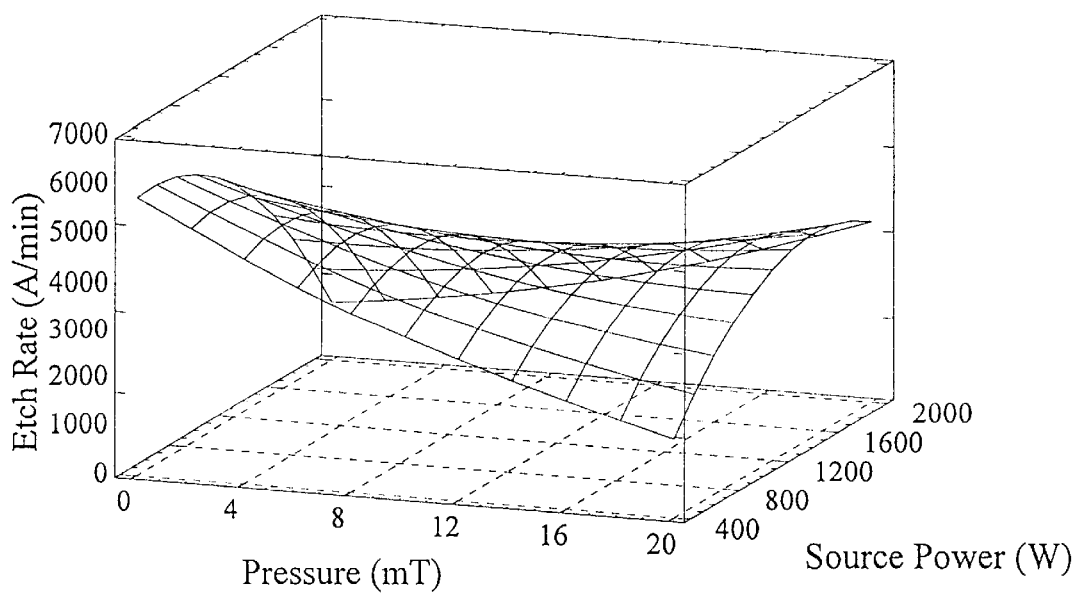
FIGS. 8a–8b are graphs showing the photoresist etch rate, and polysilicon to photoresist etching selectivity, respectively, for increasing pressure and source power.
Figure 8B:
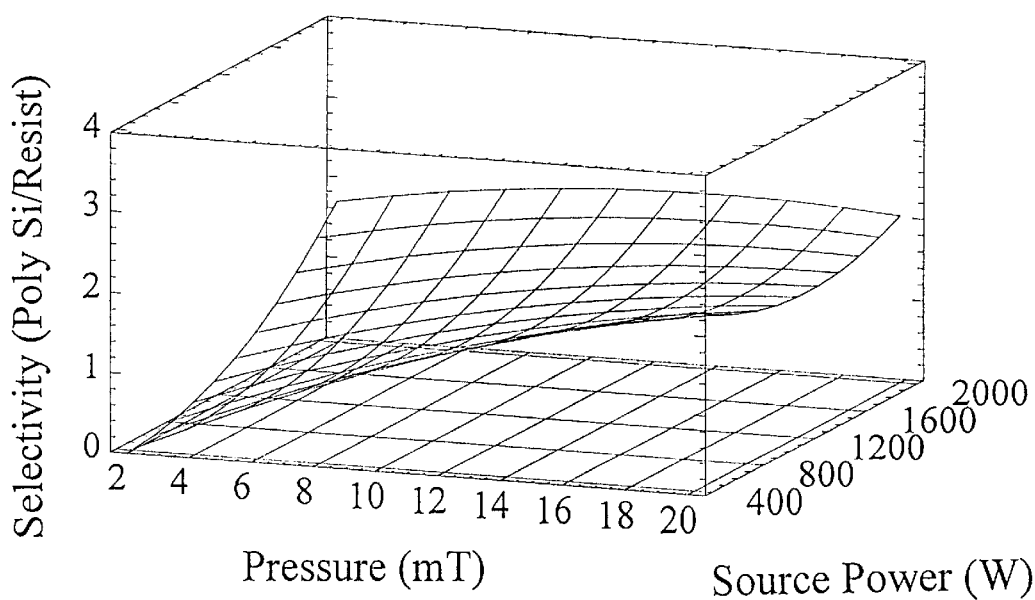

FIGS. 7a–8b show the photoresist etch rate, and polysilicon to photoresist etching selectivity, respectively, for increasing bias power and He—$O_2$ flow rates (FIGS. 7a–7b), and for increasing pressure and source power (FIGS. 8a–8b). The polysilicon to photoresist etching selectivity is reduced for increasing plasma bias power levels, and enhanced for increasing plasma source levels. It is believed that this phenomena results because increased sputter etching effects at high plasma bias power levels increases the rate of removal of photoresist, while increased chemical etching effects at high plasma source power levels produces more chemical etching effects and increased etching selectivity. Average polysilicon to photoresist etching selectivities of from about 1:1 to about 3:1 were observed.

Thus, the composition and mass flow ratios of different constituents of the process gas were selected to etch the metal silicide layer 22 faster than the polysilicon layer 24, preferably, at an etching selectivity ratio of at least about 1.1, and more preferably at least about 1.2. The mass flow ratio of the process gas is also selected to provide anisotropically etched features having sidewalls 48 with smooth surfaces that form angles ($\alpha$) of at least about 88° with a plane of the substrate 20, and more preferable angles from about 88° to about 90°. Excessive oxygen and helium content in the process gas produced more isotropic etching with undercutting of the etched features, and low oxygen and helium content and low pressures resulted in a tapered profile for the etched features. Preferably, the ratio of the mass flow of chlorine to the combined mass flow of oxygen and helium is from about 3:1 to about 20:1, and more preferably from about 7:1 to about 13:1. Preferred mass flow ratios of helium to oxygen are from about 0.25:1 to about 15:1, more preferably from about 1:1 to about 5:1. Preferably, a premixed commercially available mixture of helium and oxygen (the ratio of helium to oxygen being about 3:1) is used.

For the size of the process chamber described herein, the total flow rate of the process gas is typically from about 1 to about 1000 sccm, and more typically from about 25 to about 300 sccm. The flow rate of $Cl_2$ is preferably from about 20 to about 500 sccm, the flow rate of $O_2$ is from about 2 to about 100 sccm, and the flow rate of He is from about 2 to about 100 sccm. Preferably, a premixed oxygen and helium gas, at a flow rate of about 2 sccm to 60, is used. It should be understood that flow rates are dependent upon the size of the process chamber, and equivalent flow rates for different sized chambers are encompassed within the scope of the present invention.

The power ratio $P_r$ of the source current power level (to inductor coil 75) to the bias voltage power level (to the process electrodes 60, 65) is also selected to enhance the ability of the etchant plasma to anisotropically etch the metal silicide layer 22 with high selectivity relative to the polysilicon layer 24, the silicon dioxide layer 26, and the resist layer 30. Increasing the source power level of the current applied to the inductor coil 75, increases the amount of dissociated etchant species to provide more isotropic etching. In contrast, increasing the bias power level of the RF voltage applied to the process electrodes 60, 65 increases the degree of anisotropic etching by providing a higher kinetic bombardment energy component to the plasma. Furthermore, an excessively high power ratio $P_r$ can cause sputtering of the substrate 20 and result in non-uniform etching of the substrate. Conversely, a low power ratio $P_r$ can cause insufficient dissociation of the etchant gas into dissociated ions resulting in low etch rates and low etching selectivity. It has been discovered that a preferred power ratio $P_r$ is at least about 2:1, and more preferably from about 2:1 to about 20:1. More preferably, the plasma is formed by applying a current at a source power level of about 400 to 3000 Watts to the inductor coil 75 encircling the plasma zone 55; and the plasma is attracted to the substrate 20 by applying a voltage at a power level of about 20 to 1000 Watts to the process electrodes 60, 65 in the plasma zone.

The temperature of the substrate 20 also affects the etching selectivity of metal silicide to polysilicon layers, with high temperatures providing enhanced etching selectivity. Thus, preferably the support holding the substrate is maintained at temperatures ranging from about 20° C. to 80° C.

The following examples illustrate use of the present invention for etching metal silicide layers on semiconductor substrates. However, the apparatus and method can be used in other applications as would be apparent to those skilled in the art, and the scope of the present invention should not be limited to the illustrative examples provided herein.

In these examples, the etching processes were performed on silicon substrates having a diameter of 200 mm (8 inches). Each substrate comprised (i) a top 2000 Å thick layer of $WSi_x$, (ii) a middle 2000 Å thick layer of phosphorous doped polysilicon, and (iii) a lower 1000 Å gate oxide $SiO_2$ layer deposited on the monocrystalline silicon substrate. The $WSi_x$ layer on the substrates comprised either of two different Si:W ratios of about 2.1:1 or about 2.96:1, and comprised either a doped polysilicon layer or an undoped polysilicon layer. The different Si:W ratios were used to determine the variation of etching rates for $WSi_x$ layers having different Si:W ratios. The substrates were etched in a "DPS" process chamber having the configuration described above, and the support 52 in the chamber was maintained at a temperature of 65° C.

SEM photos of the etched wafers were used to measure (i) the metal silicide or polysilicon etch rate, (ii) the etching selectivity ratio of etching metal silicide relative to polysilicon, and (iii) the sidewall 48 profile angle. Etch rates were calculated by measuring the step height or depth of the etched features 40 observed in the SEM photographs. The etching selectivity ratio was calculated from the ratio of the etch rate of the metal silicide layers to the etch rate of the polysilicon layer 24.

Examples 1 and 2 used a process gas comprising 128 sccm $Cl_2$ and 13 sccm He—$O_2$ to demonstrate the etching performance of conventional etching processes. In both examples, the power level of the current applied to the inductor coil was 685 Watts, and the power level of the bias voltage applied to the process electrodes was 80 Watts to provide a power ratio, $P_r$, of at least about 8.1. In Example 1, the pressure was held at 9 mTorr; and in Example 2, the pressure was held at 4 mTorr. Also, in Example 1, the $WSi_x$ layer on the substrate comprised an Si:W ratio of about 2.1:1; and in Example 2, the $WSi_x$ layer on the substrate comprised an Si:W ratio of about 2.98:1.

Figure 9:
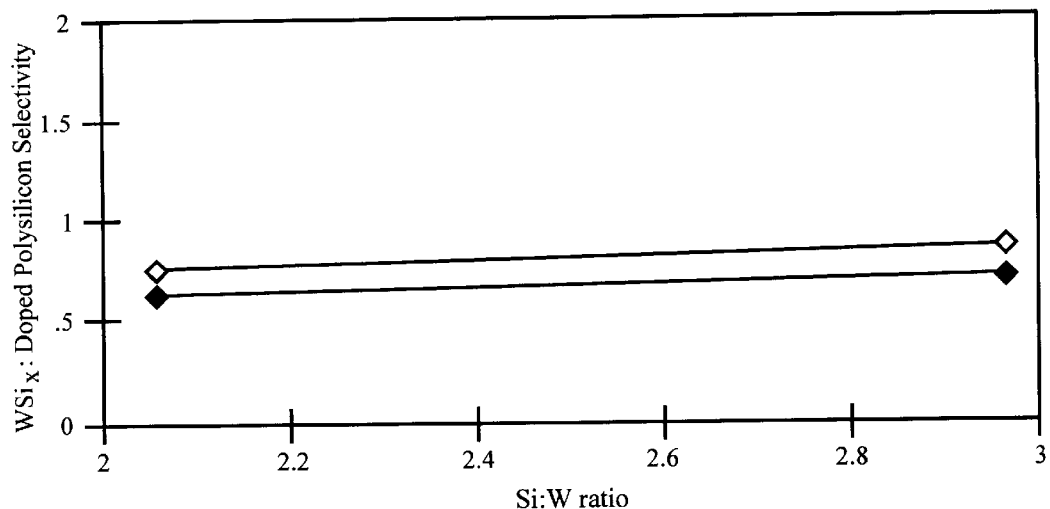
FIG. 9 is a graph showing the $WSi_x$ to doped polysilicon etching selectivity for increasing Si:W ratio in the $WSi_x$ film.
Figure 10:
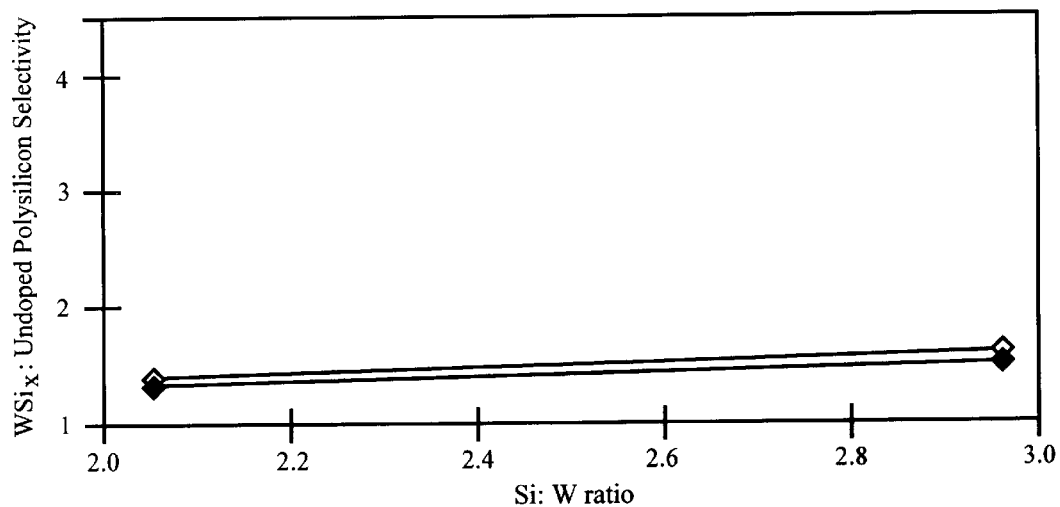
FIG. 10 is a graph showing the $WSi_x$ relative to undoped polysilicon etching selectivity for increasing Si:W ratio in the $WSi_x$ film.

FIG. 9 shows the etching selectivity ratio for etching $WSi_x$ films relative to doped polysilicon for the increasing Si:W ratio of the $WSi_x$ films of Examples 1 and 2. It is observed that the $Cl_2/O_2$/He process gas provide relatively uniform etching selectivity ratios of about 0.5 to 0.7 over the entire range of Si:W stoichiometric ratios. FIG. 10 shows the etching selectivity ratio for etching $WSi_x$ films relative to undoped polysilicon for increasing Si:W ratio in the $WSi_x$ film, for Examples 1 and 2. It is observed that the $Cl_2/O_2$/He process gas provide relatively uniform etching selectivity ratios ranging from between about 1 and 2, for the entire range of Si:W stoichiometric ratios. The uniformity of the etching selectivity ratios over a wide range of Si:W ratios in both the doped and undoped polysilicon provides process reproducibility for etching $WSi_x$ layers having varying Si:W ratios.

Although the present invention has been described in considerable detail with regard to the preferred version thereof, other versions are possible. Therefore, the appended claims should not be limited to the description of the preferred versions contained herein.

What is claimed is:

1. A method of selectively etching a substrate comprising metal silicide and polysilicon layers, the method comprising the steps of:
   (a) placing the substrate in a process chamber comprising process electrodes therein, and an inductor coil adjacent to the process chamber;
   (b) introducing a process gas comprising chlorine, oxygen, and helium into the process chamber;
   (c) ionizing the process gas to form a plasma by (i) applying an RF source power of about 400 to about 3000 Watts to the inductor coil, and (ii) applying an RF bias power to the process electrodes,
   wherein a ratio $P_r$ of the source power to the bias power is selected to be sufficiently high to etch the metal silicide layer at a first etch rate that is at least about 1.2 times a second rate of etching of the polysilicon layer, whereby anisotropic etching of the metal silicide and polysilicon layers is obtained.

2. The method of claim 1, wherein in step (c), the ratio $P_r$ is at least about 2:1.

3. The method of claim 2, wherein in step (c), the ratio $P_r$ is from about 2:1 to about 20:1.

4. The method of claim 1, wherein the ratio $P_r$ of the source power to the bias power is sufficiently high to etch the silicide and polysilicon layers to form etched features having sidewalls that form angles of from about 88° to about 90° with a surface of the substrate.

5. The method of claim 1, wherein the mass flow ratio of helium to oxygen is from about 0.25:1 to about 15:1.

6. The method of claim 1, wherein the ratio of the mass flow rate of chlorine to the combined mass flow rate of oxygen and helium is from about 3:1 to about 20:1.

7. The method of claim 1, wherein in step (c), the bias power applied to the process electrodes is from about 20 to about 1000 Watts.

8. The method of claim 1, wherein the plasma zone is maintained at a pressure of from 0.1 to 100 mTorr.

9. The method of claim 1, wherein the ratio $P_r$ is at least about 8:1.

10. The method of claim 2, wherein the ratio $P_r$ is from about 8:1 to about 20:1.

11. The method of claim 1 wherein the process gas consists essentially of chlorine, oxygen, and helium.

12. The method of claim 11 wherein the ratio $P_r$ is from about 8:1 to about 20:1.

13. The method of claim 8 wherein the process gas is maintained at a pressure below about 10 mTorr.

14. The method of claim 13 wherein the source power is between about 800 and about 1600 Watts.

15. The method of claim 14 wherein the process gas is maintained at a pressure between about 4 mTorr and about 10 mTorr.

16. The method of claim 15 wherein the source power is greater than about 1000 Watts.

* * * * *